United States Patent
Teranishi (10) Patent No.: US 11,168,397 B2
(45) Date of Patent: Nov. 9, 2021

(54) METHOD FOR PRODUCING SUBSTRATE, SUBSTRATE, AND LIQUID EJECTION HEAD

(71) Applicant: CANON KABUSHIKI KAISHA, Tokyo (JP)

(72) Inventor: Atsushi Teranishi, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 864 days.

(21) Appl. No.: 15/806,716

(22) Filed: Nov. 8, 2017

(65) Prior Publication Data

US 2018/0179632 A1 Jun. 28, 2018

(30) Foreign Application Priority Data

Dec. 22, 2016 (JP) .............................. JP2016-249149

(51) Int. Cl.
| | |
|---|---|
| *C23C 16/56* | (2006.01) |
| *C23C 16/40* | (2006.01) |
| *C23C 16/455* | (2006.01) |
| *B41J 2/16* | (2006.01) |
| *B41J 2/14* | (2006.01) |

(52) U.S. Cl.
CPC .............. *C23C 16/56* (2013.01); *B41J 2/1433* (2013.01); *B41J 2/14145* (2013.01); *B41J 2/162* (2013.01); *B41J 2/1603* (2013.01); *B41J 2/1628* (2013.01); *B41J 2/1629* (2013.01); *B41J 2/1631* (2013.01); *B41J 2/1632* (2013.01); *B41J 2/1639* (2013.01); *B41J 2/1642* (2013.01); *B41J 2/1646* (2013.01); *C23C 16/405* (2013.01); *C23C 16/45525* (2013.01); *B41J 2002/14467* (2013.01)

(58) Field of Classification Search
CPC .. C23C 16/56; C23C 16/405; C23C 16/45525
See application file for complete search history.

(56) References Cited

U.S. PATENT DOCUMENTS

| | | | |
|---|---|---|---|
| 5,322,811 A | 6/1994 | Komuro et al. | |
| 6,447,107 B1 | 9/2002 | Chino et al. | |
| 6,497,474 B2 | 12/2002 | Irinoda et al. | |
| 7,229,158 B2 | 6/2007 | Park et al. | |
| 8,052,828 B2 | 11/2011 | Takahashi et al. | |
| 8,445,298 B2 | 5/2013 | Takeuchi et al. | |

(Continued)

FOREIGN PATENT DOCUMENTS

| | | |
|---|---|---|
| JP | 5-8391 A | 1/1993 |
| JP | 5-212871 A | 8/1993 |

(Continued)

*Primary Examiner* — Kelly M Gambetta
(74) *Attorney, Agent, or Firm* — Venable LLP (57) ABSTRACT

A method for producing a substrate that includes a protective layer made from a metal oxide protecting silicon against corrosion and an organic resin layer on a substrate surface of a silicon substrate includes the following steps in this order: step A of forming the protective layer on the substrate surface; step B of removing the protective layer from the substrate surface in a region Z1 that is a part of the region in which the protective layer has been formed; and step C of providing an organic resin layer on the substrate surface in a region Z2 including the region Z1.

7 Claims, 9 Drawing Sheets

(56) References Cited

U.S. PATENT DOCUMENTS

| | | | |
|---|---|---|---|
| 2005/0262691 A1* | 12/2005 | Torimoto | B41J 2/1623 29/890.1 |
| 2006/0014107 A1* | 1/2006 | Park | B41J 2/1631 430/320 |
| 2007/0285471 A1 | 12/2007 | Park et al. | |
| 2017/0072692 A1* | 3/2017 | Chen | B41J 2/155 |
| 2017/0341389 A1* | 11/2017 | Terasaki | B41J 2/1646 |

FOREIGN PATENT DOCUMENTS

| | | |
|---|---|---|
| JP | 2002-347247 A | 12/2002 |
| JP | 2004-074809 A | 3/2004 |
| JP | 2005-067203 A | 3/2005 |
| JP | 2006-225745 A | 8/2006 |
| JP | 2006-227544 A | 8/2006 |
| JP | 2009-113229 A | 5/2009 |
| JP | 2011-073440 A | 4/2011 |
| JP | 2015-56636 A | 3/2015 |
| JP | 2016-175232 A | 10/2016 |
| WO | 2015/147804 A1 | 10/2015 |
| WO | 2016/078957 A1 | 5/2016 |

* cited by examiner

FIG. 10

METHOD FOR PRODUCING SUBSTRATE, SUBSTRATE, AND LIQUID EJECTION HEAD

BACKGROUND OF THE INVENTION

Field of the Invention

The present invention relates to a method for producing a substrate, a substrate, and a liquid ejection head.

Description of the Related Art

In a liquid ejection head such as an ink jet recording head, holes as a liquid flow path and a liquid supply port for allowing an ejection liquid to flow are formed in a substrate made from silicon or the like. Typically, the holes are formed by engraving a substrate, and some holes may be formed as penetration ports through a substrate. On a substrate, structures including a flow path forming member that forms a flow path between the flow path forming member and the substrate and an ejection opening forming member that forms an ejection opening may be provided, and the flow path forming member may have an ejection opening. On a substrate, an energy generating element that generates energy for ejecting a liquid may be provided, and a liquid is ejected from an ejection opening by applying energy to the liquid.

As a method for producing such a structure as a flow path forming member and an ejection opening forming member, Japanese Patent Application Laid-Open No. 2006-227544 discloses a method of producing a top plate of an organic resin on a substrate by attaching a photosensitive resin film onto a substrate having a fine concave portion and exposing and developing the film.

Meanwhile, when a hole serving as a liquid supply port or a liquid flow path is formed in a silicon substrate, a member (for example, silicon) exposed on the inner wall surface of the hole may be dissolved depending on the type of an ejection liquid used or use conditions. Silicon is dissolved especially when an alkaline ink is used in many cases. Even when an extremely small amount of silicon is dissolved, the silicon dissolved in an ejection liquid may affect ejection performance or image formation or may destroy the configuration of a hole such as a flow path after long-time use. To address this, the silicon exposed on the inner wall of such a hole can be protected.

Japanese Patent Application Laid-Open No. 2002-347247 discloses an example of forming a liquid resistant thin film containing an organic resin on a surface that comes into contact with a liquid. Japanese Patent Application Laid-Open No. 2004-074809 discloses an example of forming an ink resistant thin film from titanium, a titanium compound (TiN, $TiO_2$), or alumina ($Al_2O_3$).

Japanese Patent Application Laid-Open No. 2009-113229 discloses a liquid resistant film formation method capable of forming a liquid resistant film causing few defects in a liquid contact part of a substrate. The document discloses that a monomolecular layer of a metal oxide film or a laminated film thereof is formed on a liquid contact part by atomic layer deposition (ALD). As the metal of the metal oxide, Ti, Zr, Hf, V, Nb, Ta, Cr, or Mo is disclosed.

SUMMARY OF THE INVENTION

An aspect of the present invention provides a method for producing a substrate that includes a protective layer made from a metal oxide protecting silicon against corrosion and an organic resin layer on a substrate surface of a silicon substrate. The method includes the following steps in this order:

step A of forming the protective layer on the substrate surface;

step B of removing the protective layer from the substrate surface in a region Z1 that is a part of a region in which the protective layer has been formed; and step C of providing an organic resin layer on the substrate surface in a region Z2 including the region Z1.

Another aspect of the present invention provides a method for producing a liquid ejection head, in which the liquid ejection head includes a silicon substrate having one substrate surface with an energy generating element configured to eject a liquid, a protective layer made from a metal oxide protecting silicon against corrosion and an organic resin layer are formed on an opposite substrate surface of the silicon substrate to the one substrate surface, the silicon substrate has a penetration port configured to supply a liquid from the opposite substrate surface to the one substrate surface, and the organic resin layer continues over an opening of the penetration port and has an opening communicating with the penetration port. The method includes the following steps in this order:

step i of forming a penetration port in a silicon substrate having one substrate surface with an energy generating element configured to eject a liquid;

step ii of forming the protective layer on both the substrate surfaces of the silicon substrate and on an inner wall surface of the penetration port;

step iii of removing the protective layer from the opposite substrate surface in a region Z1 that is a part of a region in which the protective layer has been formed; and step iv of providing, on the opposite substrate surface in a region Z2 including the region Z1, an organic resin layer continuing over an opening of the penetration port and having an opening communicating with the penetration port.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

The inventors of the present invention have studied a construction in which a metal oxide film (especially, a titanium oxide film formed by ALD method) is used as a liquid resistant thin film, and an organic resin layer usable as an organic resin structure is stacked in contact with the liquid resistant thin film formed on silicon. In such a construction, the adhesion between the organic resin layer and the liquid resistant thin film may deteriorate in some cases. The inventors of the present invention have analyzed the adhesion deterioration and have ascertained that the liquid resistant thin film degenerates at a peeling position on the close contact interface between the organic resin layer and the liquid resistant thin film for protecting silicon. The degeneration is supposed to be caused by a phenomenon in which metal (titanium) in the liquid resistant film is replaced with positive ions in an ejection liquid that reaches an end of the close contact interface or reaches the close contact interface through the organic resin layer to result in adhesion deterioration.

Such a phenomenon can occur not only in a liquid ejection head but also on a substrate in which a protective layer of a metal oxide film for protecting silicon against corrosion and an organic resin layer are formed on a silicon substrate.

The present invention is intended to provide methods for producing a substrate and a liquid ejection head capable of suppressing peeling of an organic resin layer from a silicon substrate even when a protective film made from a metal oxide that prevents silicon from dissolving is used.

Embodiments of the present invention will now be described with reference to drawings, but the invention is not intended to be limited to the embodiments.

First Embodiment

Figure 1A:
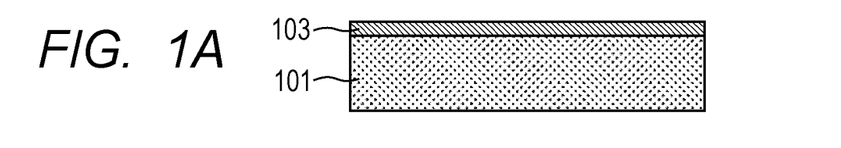
FIGS. 1A, 1B and 1C are schematic cross-sectional views for describing an example of a first embodiment.
Figure 1B:
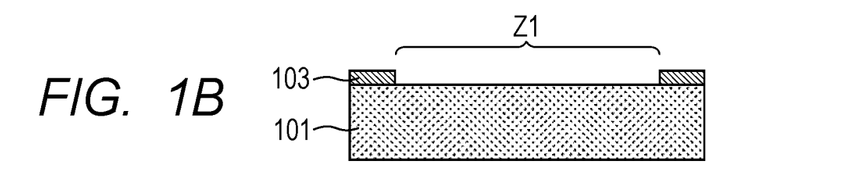
Figure 1C:
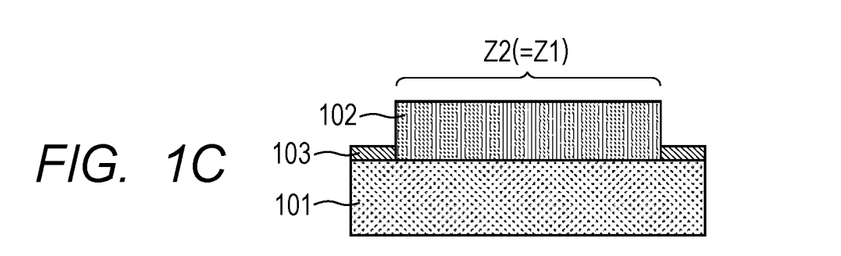

The present invention relates to a method for producing a substrate that includes a protective layer protecting silicon against corrosion and an organic resin layer on a substrate surface (hereinafter also called "first substrate surface") of a silicon substrate. FIGS. 1A to 1C are schematic cross-sectional views for describing an exemplary process of the present invention.

As shown in FIG. 1A, a protective layer 103 made from a metal oxide (hereinafter also called "first protective layer") is formed on a first substrate surface of a silicon substrate 101 (step A).

As shown in FIG. 1B, the first protective layer 103 is next removed from the first substrate surface in a region Z1 that is a part of the region in which the first protective layer 103 has been formed (step B).

As shown in FIG. 1C, an organic resin layer 102 is then provided on the first substrate surface in a region Z2 including the region Z1 (step C). In the figure, the region Z2 is the same as the region Z1, but the region Z2 may be larger than the region Z1 as shown in FIGS. 2A and 2B.

In the configuration prepared as above, the organic resin layer 102 is provided on the substrate surface from which the first protective layer 103 is removed, and the organic resin layer 102 is in contact with the first substrate surface. The first protective layer 103 is also in contact with the first substrate surface. On the silicon substrate 101, the organic resin layer 102 and the first protective layer 103 are formed adjacent to each other.

By selecting materials having high adhesion to the substrate 101 for the organic resin layer 102 and the first protective layer 103 to form the configuration, the first protective layer 103 can protect the silicon substrate 101 against corrosion while the organic resin layer 102 is prevented from peeling due to, for example, long-time immersion in an ejection liquid.

Figure 2A:
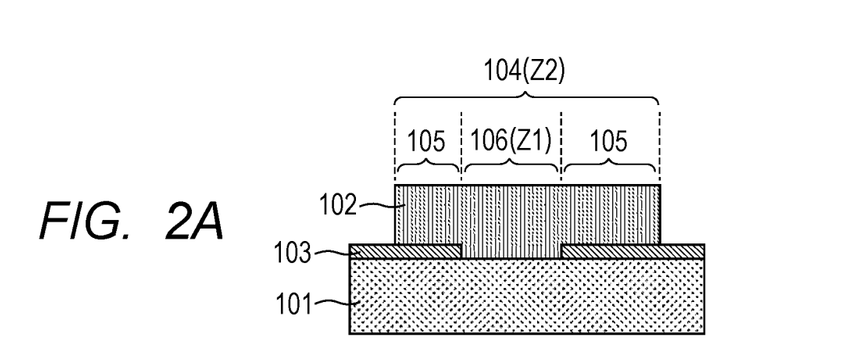
FIGS. 2A and 2B are schematic cross-sectional views for describing another example of the first embodiment.
Figure 2B:
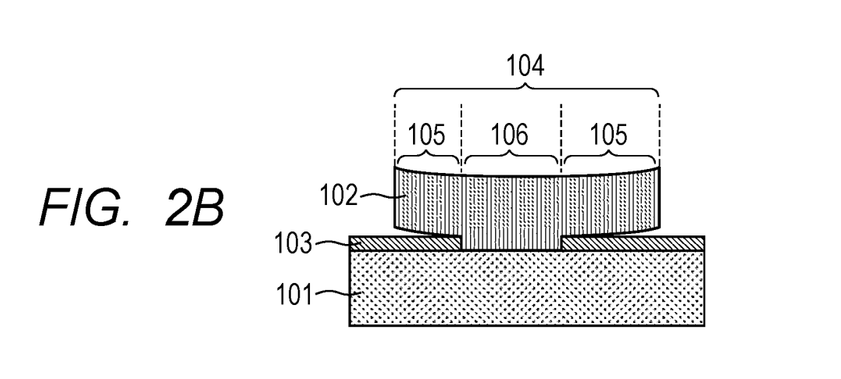

As shown in FIG. 2A, even when the region Z2 (a region 104 in which the organic resin layer 102 is provided) is larger than the region Z1 (a region 106 in which the organic resin layer 102 is in contact with the substrate 101), the organic resin layer 102 is in contact with the substrate 101, and a part of the organic resin layer 102 overlaps with the first protective layer 103 in a region 105 in which the first protective layer 103 is in contact with the substrate 101, the same effect as above should be exerted. The region 106 that is a part of the region Z2 is a region in which the organic resin layer 102 is in contact with the silicon substrate 101. In other words, the first protective layer 103 is absent between the organic resin layer 102 and the silicon substrate 101 in the region. In the remaining region 105 in the region Z2, the organic resin layer 102 is in contact with the first protective layer 103, and the first protective layer 103 is in contact with the silicon substrate 101. In other words, the first protective layer 103 is present between the organic resin layer 102 and the silicon substrate 101 in the region.

As shown in FIG. 2B, for example, the first protective layer 103 may degenerate as described above, and consequently, interfacial peeling may occur between the organic resin layer 102 and the first protective layer 103 in the region 105. Although the peeling develops in the region 105, no interfacial peeling develops after the peeling reaches the region 106 in which the silicon substrate 101 is in direct contact with the organic resin layer 102. Accordingly, the adhesion of the whole system can be maintained.

In consideration of an adhesion force or adhesion area depending on a purpose, the region 106 in which the silicon substrate 101 is in contact with the organic resin layer 102 can be appropriately designed. This can achieve such a strength as to prevent the organic resin layer 102 from peeling mechanically from the silicon substrate 101 or such a strength as to prevent an ejection liquid from penetrating across regions separated by the organic resin layer 102 (for example, the inside (hole 310) and the outside of the configuration shown in FIG. 3). From these viewpoints, the proportion of the region Z1 (106) to the region Z2 (104) in which the organic resin layer 102 is provided is preferably 50% or more and more preferably 80% or more.

The first protective layer 103 is made from a metal oxide and functions to prevent Si corrosion in the use environment of a silicon substrate 101. For example, in a liquid ejection head, Si is prevented from dissolving in an ejecting liquid. Of the exposed silicon surface, an area where Si could dissolve to affect the performance or reliability at the time of use can be protected by the first protective layer 103. On a silicon substrate 101 in which the above liquid supply port or the liquid flow path is formed, the first protective layer 103 is preferably formed on the whole exposed silicon surface.

In order to form the first protective layer 103, a film formation technique such as a chemical vapor deposition method (CVD method), a sputtering method, and atomic layer deposition can be adopted depending on the configuration of an exposed silicon surface, and specifically, atomic layer deposition achieving good adhesion characteristics is preferred.

The material of the first protective layer 103 is exemplified by oxides of Ti, Zr, Hf, V, Nb, Ta, and the like in terms of high corrosion resistance especially against an alkaline solution, and a titanium oxide (TiO) film is preferred, for example.

Figure 3:
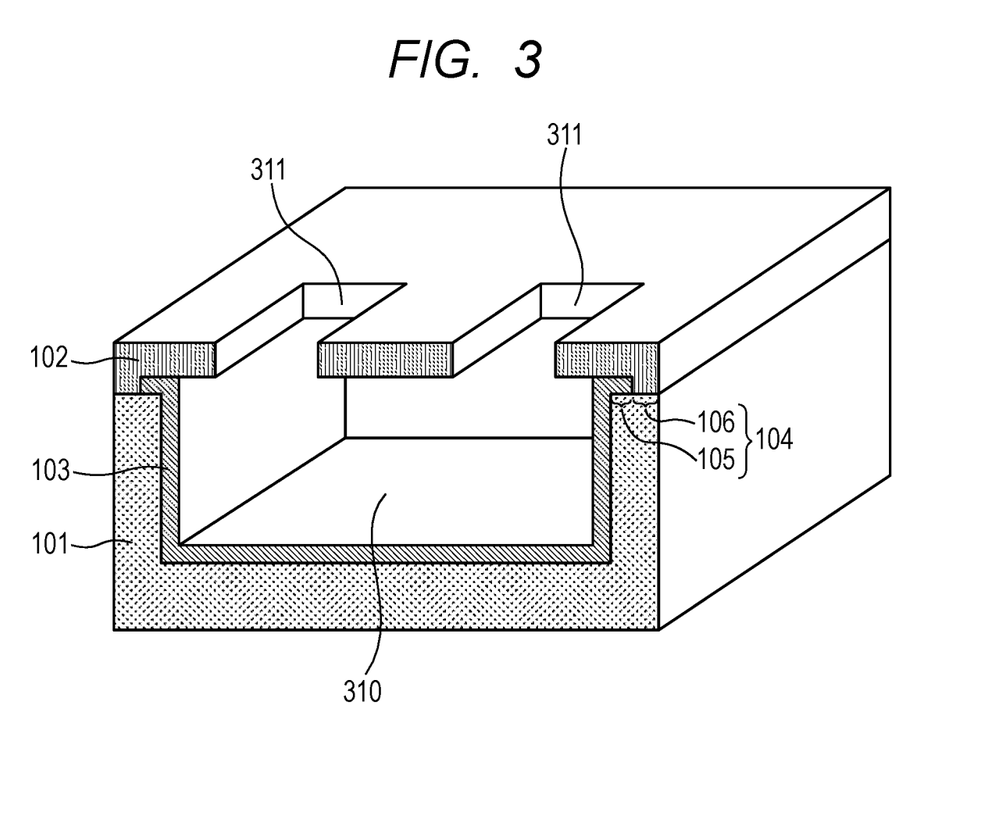
FIG. 3 is a schematic cross-sectional perspective view for describing another example of the first embodiment.

The organic resin layer 102 can be used as a structure having any mechanical configuration such as a liquid flow path. FIG. 3 shows a configuration example of a substrate having a structure of the organic resin layer 102. In order to prepare the configuration shown in FIG. 3, a hole 310 is formed in a silicon substrate 101 from a first substrate surface (upper surface in FIG. 3) as a flow path configuration through which a liquid flows. The hole 310 is a bottomed hole at this stage. On the remaining first substrate surface (region 104) and the whole region on the inner wall surface of the hole 310, a first protective layer 103 is formed. The first substrate surface (region 104) constitutes the edge of the hole 310. In a region 106 that is a part of the region 104, the first protective layer 103 is removed. In the remaining region 105 in the region 104, the first protective layer 103 is left. In the substrate in-plane direction, the region 106 is positioned outside the region 105 and constitutes the outer edge of the first substrate surface in the configuration shown in FIG. 3. In this manner, a substrate having the first protective layer 103 on the first substrate surface region 105 and the whole inner wall of the hole 310 is prepared. On the first substrate surface (region 104) of the substrate, an organic resin layer 102 is stacked. The organic resin layer 102 continues over the opening of the hole 310 and serves as a cover covering the hole 310. However, the cover has openings 311 communicating with the hole 310. In the region 106, the organic resin layer 102 is in contact with the silicon substrate 101, whereas in the region 105, the organic resin layer 102 is in contact with the first protective layer 103, and the first protective layer 103 is in contact with the silicon substrate 101. In other words, the configuration corresponds the embodiment shown in FIG. 2A.

Such a protective layer 103 as shown in FIG. 3 can be prepared by, for example, atomic layer deposition. When a hole 310 has a small aspect ratio (hole depth/hole opening diameter), a protective layer 103 can also be prepared by a CVD method. In order to remove a part of the protective layer formed on the substrate, a patterning method such as wet etching, dry etching, and a lift-off method can be adopted.

In a liquid ejection head, a structure including the organic resin layer 102 constitutes a liquid flow path forming member, a liquid ejection opening forming member, a protective member, or a similar member. The material of the organic resin layer 102 is preferably exemplified by an epoxy resin, an aromatic polyimide, an aromatic polyamide, and an aromatic hydrocarbon resin for reasons of high mechanical strength and high corrosion resistance against an ejection liquid or the like, for example.

Second Embodiment

Other embodiments of the present invention will be described with reference to FIGS. 4A to 4C. In each configuration example shown in FIGS. 4A to 4C, an organic resin layer 102 and a first protective layer 103 are formed on a first substrate surface of a silicon substrate 101. In the configuration, a secondary protective layer (hereinafter also called "second protective layer") 301 is formed in at least a part of the region interposed between the silicon substrate 101 and the organic resin layer 102. By selecting materials of members in consideration of adhesion between members in contact with each other to form the configuration, the first protective layer 103 and the second protective layer 301 can protect the silicon substrate 101 against corrosion while the organic resin layer 102 is prevented from peeling due to, for example, long-time immersion in a liquid.

Figure 4A:
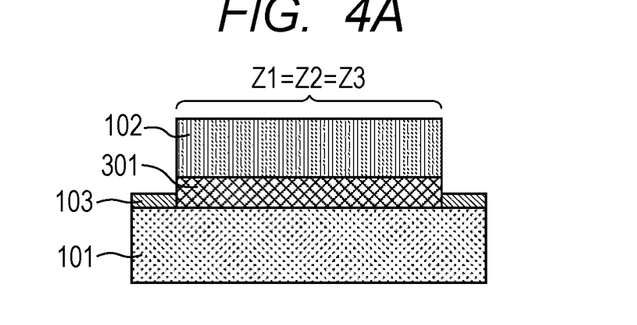
FIGS. 4A, 4B and 4C are schematic cross-sectional views for describing examples of a second embodiment.

In order to prepare the configuration shown in FIG. 4A, a first protective layer 103 is formed on a first substrate surface of a silicon substrate 101 (step A). The first protective layer 103 is then removed from the first substrate surface in a region Z1 that is a part of the region in which the first protective layer 103 has been formed (step B). The above steps are the same as in the case shown in FIGS. 1A to 1C. Next, a secondary protective layer 301 is formed on the first substrate surface in a region Z3 including the region Z1. An organic resin layer 102 is then provided above the first substrate surface in a region Z2 including the region Z1. In the configuration shown in FIG. 4A, the region Z1, the region Z3, and the region Z2 are the same region.

Figure 4B:
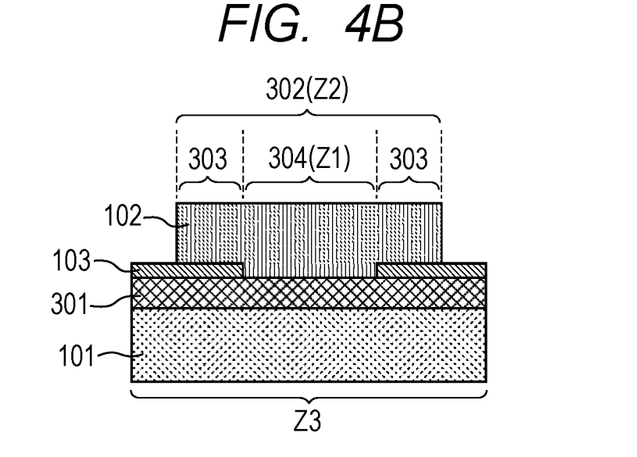
Figure 4C:
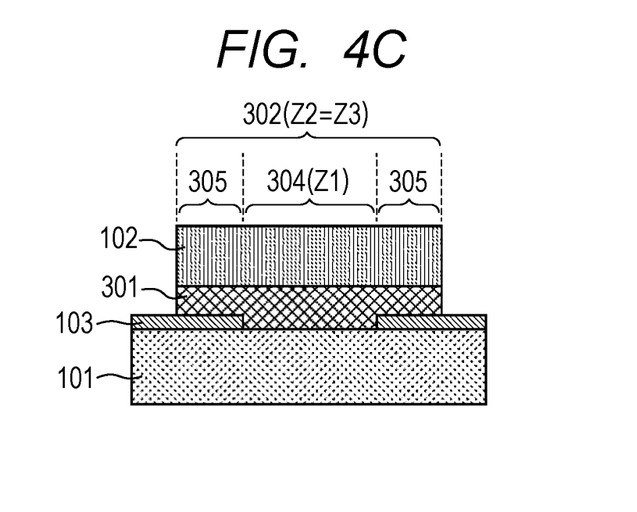

As shown in FIG. 4B or FIG. 4C, a region Z2 (a region 302 in which a second protective layer 301 is present between an organic resin layer 102 and a substrate 101) may be larger than a region Z1 (a region 304 in which, on a substrate 101, a second protective layer 301 and an organic resin layer 102 are stacked in this order). In a region 303 in which, on a substrate 101, a second protective layer 301, a first protective layer 103, and an organic resin layer 102 are stacked in this order or in a region 305 in which, on a substrate 101, a first protective layer 103, a second protective layer 301, and an organic resin layer 102 are stacked in this order, a part of the organic resin layer 102 may be formed above the first protective layer 103.

For example, to prepare the configuration example shown in FIG. 4B, a second protective layer 301 is formed on the first substrate surface in a region Z3. In the example, the region Z3 is the whole region on the first substrate surface. Next, a first protective layer 103 is formed (step A). In the example, the first protective layer 103 is formed in the whole region on the first substrate surface. The first protective layer 103 in a region Z1 is then removed (step B). Next, an organic resin layer 102 is formed in a region Z2. In the example, the region Z2 (region 302) is smaller than the region Z3 (the whole region on the first substrate surface).

The region 302 is the region in which the organic resin layer 102 is present, and the second protective layer 301 is present between the organic resin layer 102 and the silicon substrate 101. The region 304 is the region with the configuration in which, on the first substrate surface of the silicon substrate 101, the second protective layer 301 and the organic resin layer 102 are stacked in this order. The region 303 is the region with the configuration in which, on the first substrate surface of the silicon substrate 101, the second protective layer 301, the first protective layer 103, and the organic resin layer 102 are stacked in this order.

As described in the first embodiment, when a first protective layer 103 is in contact with an organic resin layer 102, the first protective layer 103 may degenerate, and this may cause interfacial peeling in the region 303. However, after the peeling reaches the region 304 in which the second protective layer 301 is in contact with the organic resin layer 102, no interfacial peeling develops. Hence, the adhesion of the whole system can be maintained.

In consideration of an adhesion force or adhesion area depending on a purpose, the region in which the second protective layer 301 is in contact with the organic resin layer 102 can be appropriately designed. This can achieve such a strength as to prevent the organic resin layer 102 from peeling mechanically from the silicon substrate 101 (or from the second protective layer 301) or such a strength as to prevent an ejection liquid from penetrating across regions separated by the organic resin layer 102. From these viewpoints, the proportion of the region 304 to the region 302 in which the organic resin layer 102 is provided is preferably 50% or more and more preferably 80% or more.

Preferably, the second protective layer 301 intrinsically has high adhesion to the organic resin layer 102, causes no peeling of a close contact interface with the organic resin layer 102 even when undergoing, for example, long-time immersion in an ejection liquid, and does not allow positive ions in a liquid to pass through. More preferably, the second protective layer 301 also has high adhesion to the first protective layer 103. When the adhesion between a second protective layer 301 and a first protective layer 103 is sufficient, the second protective layer 301 may be formed between the organic resin layer 102 and the first protective layer 103 in a partial region (region 305) on the first substrate surface as shown in FIG. 4C.

To prepare the configuration example shown in FIG. 4C, a first protective layer 103 is formed on a first substrate surface. In the example, the first protective layer 103 is formed in the whole region on the first substrate surface (step A). The first protective layer 103 in a region Z1 is then removed (step B). Next, a second protective layer 301 is formed in a region Z3. An organic resin layer 102 is then formed in a region Z2. In the example, the region Z3 is the same as the region Z2 (region 302). The region Z2 or the region Z3 is a part of the region on the first substrate surface. The region 305 is the region with the configuration in which, on the first substrate surface of the silicon substrate 101, the first protective layer 103, the second protective layer 301, and the organic resin layer 102 are stacked in this order.

The material of the second protective layer 301 is preferably, as an inorganic material, a silicon-based material containing one or more elements selected from the group consisting of oxygen, nitrogen, and carbon, for example, a silicon-based insulating material such as SiC, SiOC, SiCN, SiOCN, SiO, SiN, and SiON. Preferably, the second protective layer 301 intrinsically has resistivity against a liquid such as an ejection liquid, and from such a viewpoint, a C-atom-containing material such as SiC, SiOC, SiCN, and SiOCN is more preferred. Such a second protective layer 301 can be prepared by a common film formation method such as a CVD method and a sputtering method. When the formation region Z3 of a second protective layer 301 includes the removal region Z1 of a first protective layer 103, the formation region Z2 of the organic resin layer 102 may be a part of the region Z1.

The material of the second protective layer 301 is preferably, as an organic material, an organic resin such as an epoxy resin, a benzocyclobutene resin, and a polyamide. The film formation method of such an organic material is exemplified by a transfer method.

In the transfer method, a substrate for transfer is prepared, and an organic resin is thinly, uniformly applied onto the substrate for transfer by spin coating, slit coating, or spray coating. By bringing a part of the silicon substrate 101 in which a second protective layer 301 is intended to be formed, into contact with the applied organic resin, a film of the organic resin is formed on the silicon substrate 101. After the film formation, the whole is baked at an appropriate temperature for an appropriate time in order to cure the organic resin. The substrate for transfer preferably has dimensions equal to or more than those of the silicon substrate 101. The material of the substrate for transfer is preferably silicon, glass, or a similar material.

In the present embodiment, a second protective layer 301 is formed between a silicon substrate 101 and an organic resin layer 102. In addition, for example, by selecting a material having high resistivity to a liquid such as an ejection liquid as the material of the second protective layer 301, the silicon substrate 101 can be protected against a liquid even when the liquid infiltrates into the interface on which the organic resin layer 102 is in contact with the second protective layer 301.

The constructions shown in the first and second embodiments are not necessarily performed independently, and a plurality of embodiments can be appropriately combined and performed.

According to the present invention, a silicon substrate can be protected by a liquid resistant film while an organic resin layer used as an organic resin structure is prevented from peeling. Especially in an ink jet recording head, an adhesive or a structure made from an organic resin stacked on and attached to a substrate is prevented from peeling as well as a flow path is protected against ink elution, and thus the reliability of the ink jet recording head can be improved.

EXAMPLES

Example 1

As Example 1, the production method described in the first embodiment was used to produce a liquid ejection head. In the example, no second protective layer 301 was formed.

Figure 5A:
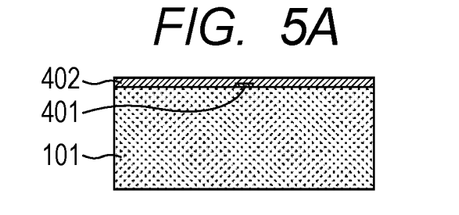
FIGS. 5A, 5B, 5C, 5D, 5E, 5F, 5G, 5H, and 5I are schematic end elevation views for describing a production process of a liquid ejection head in Example 1.

First, an 8-inch silicon substrate 101 (thickness: 625 μm) was prepared. On one surface of the silicon substrate 101, an energy generating element 401 made from a heater thin film pattern of tantalum nitride and wirings and a driving circuit 402 for supplying electric power thereto were previously formed by photolithographic process (FIG. 5A). The one surface (hereinafter also called "second substrate surface") is the upper surface in FIG. 5A and is opposite to a first substrate surface on which an organic resin layer 102 is to be formed.

Figure 5B:
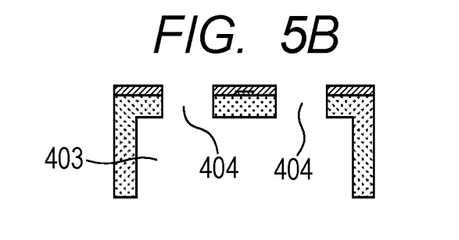

On the first substrate surface of the silicon substrate 101, a hole having a depth of about 500 μm (a bottomed hole at this stage) was formed as a liquid flow path 403 (liquid flow path from the opening on the first substrate surface to liquid supply ports 404). As the liquid supply ports 404, holes communicating with the liquid flow path 403 were formed from the second substrate surface of the silicon substrate 101 (FIG. 5B). Consequently, holes through the silicon substrate 101, or penetration ports were formed (step i).

Figure 5C:
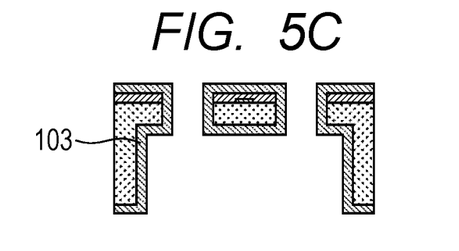

On the silicon substrate 101, a titanium oxide (TiO) film having a thickness of 85 nm was formed as a first protective layer 103 by atomic layer deposition. On the first substrate surface and the second substrate surface of the silicon substrate 101 and on the inner walls of the previously formed liquid flow path 403 and liquid supply ports 404 (i.e., the inner walls of the holes through the silicon substrate 101), a film having a substantially uniform thickness was successfully formed (FIG. 5C) (step A or step ii).

Figure 5D:
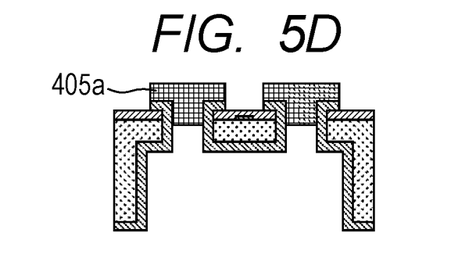
Figure 5E:
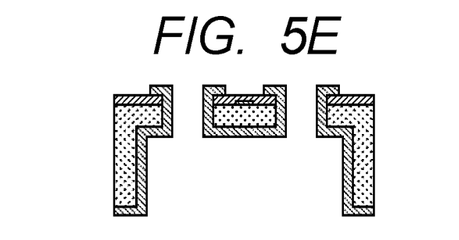

Next, a film-shaped photoresist was laminated on the second substrate surface, and a photomask and an exposure machine (manufactured by Canon, trade name: FPA-5510iV) were used to form a photoresist pattern 405a on only the liquid supply ports 404 and the periphery thereof. The resist pattern 405a was used as a mask, and the first protective layer 103 on the second substrate surface in unnecessary regions was removed by etching (FIG. 5D) (step B or step iii). The etching liquid used was a buffered hydrofluoric acid (manufactured by Daikin Industries, Ltd., trade name: Buffered hydrofluoric acid for semiconductor, BHF-110U). Here, spin etching in which an etching liquid is dropwisely added while a substrate is rotated was used, thus no etching solution was spread onto the first substrate surface of the silicon substrate 101, and only the unnecessary part of the first protective layer 103 on the second substrate surface was successfully removed. The resist pattern 405a used as the mask was then removed (FIG. 5E).

Figure 5F:
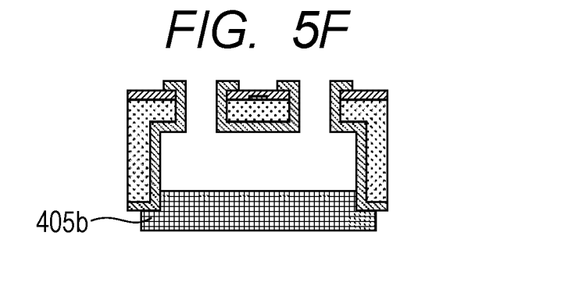
Figure 5G:
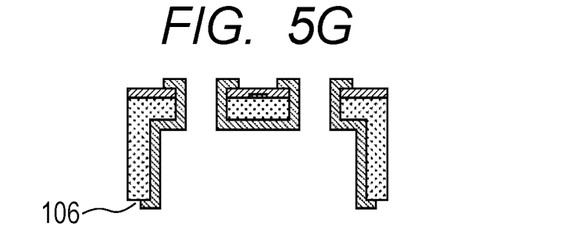

Next, also on the first substrate surface (the lower surface in FIG. 5F), a film-shaped photoresist was laminated, and a photoresist pattern 405b was formed by photolithographic process (FIG. 5F). The resist pattern 405b was used as an etching mask covering regions except the region in which an organic resin layer 102 was intended to be in contact with the silicon substrate 101. The first protective layer 103 on the first substrate surface in unnecessary regions was etched and removed to expose parts of silicon of the first substrate surface (a region 106), and then the resist pattern 405b was removed (FIG. 5G). The etching method and the removal method of the resist used as the mask were the same as in the process for the second substrate surface.

Figure 5H:
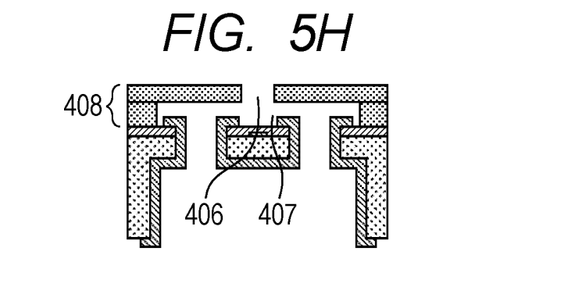

Next, a film-shaped photosensitive epoxy resin (manufactured by Tokyo Ohka Kogyo Co., Ltd., trade name: TMMF) was used to repeat lamination, exposure, and development twice, thereby forming a flow path forming member 408 on the second substrate surface. The flow path forming member 408 is a member having a liquid ejection opening 406 and forming a liquid flow path 407 from the liquid supply ports 404 to the liquid ejection opening 406, between the flow path forming member and the second substrate surface (FIG. 5H).

Figure 5I:
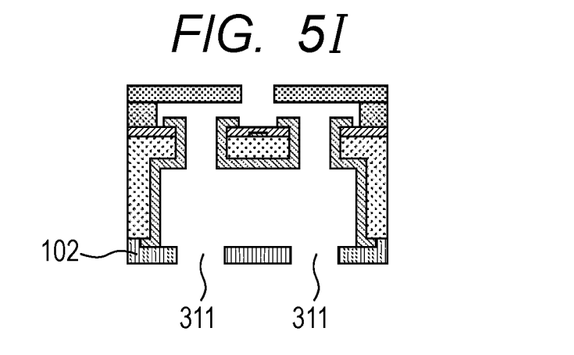
Figure 6:
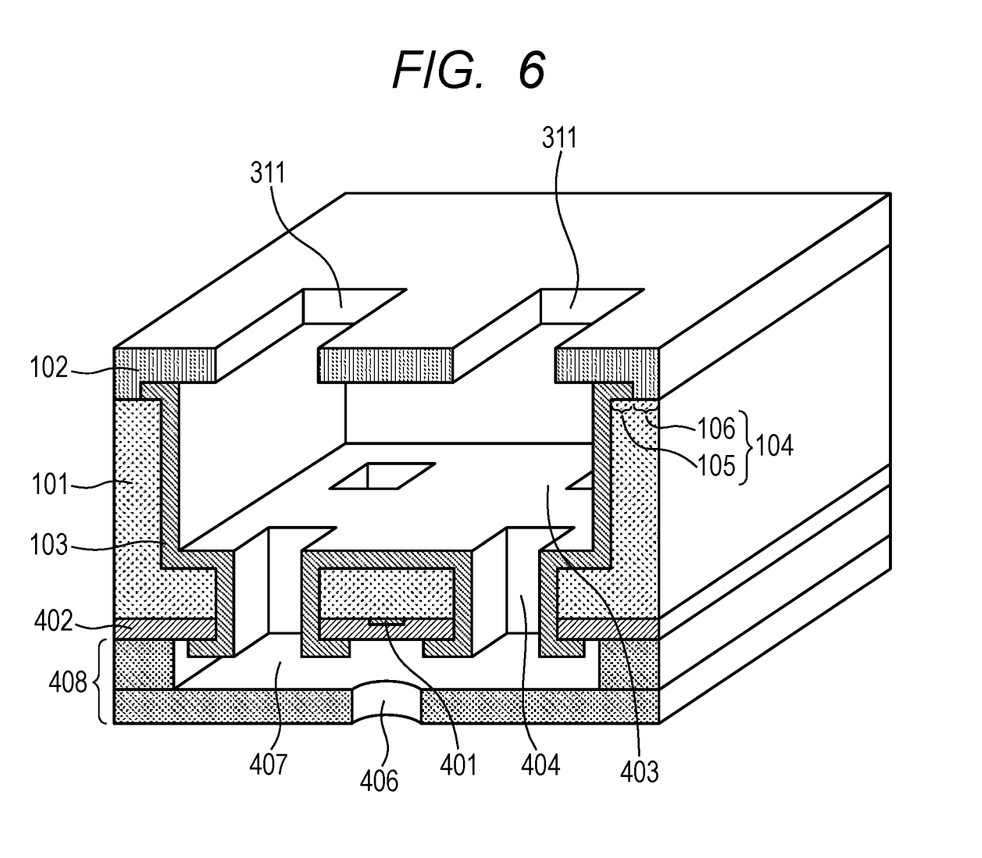
FIG. 6 is a schematic cross-sectional perspective view showing the configuration of the liquid ejection head produced in Example 1.

On the first substrate surface, a film-shaped photosensitive epoxy resin was next laminated and was exposed and developed, thereby forming an organic resin layer 102. The film-shaped photosensitive epoxy resin had been prepared by applying an epoxy resin solution (manufactured by Nippon Kayaku Co., Ltd., trade name: SU-8 2000) onto an optical film and drying the solution. The contact area between the organic resin layer 102 and the first substrate surface was designed to be 80% or more of the area of the first substrate surface in each place. Specifically, the width of the region 106 shown in FIG. 6 was 80% or more of the width of the region 104. Finally, the whole was heated at 200° C., and the epoxy resin was sufficiently cured, thereby completing a liquid ejection head substrate (FIG. 5I and FIG. 6 (a cross-sectional perspective view in which the top and bottom in FIG. 5I are reversed)) (step C or step iv). The organic resin layer 102 continues over the opening of the hole through the substrate (or the liquid flow path 403) and serves as a cover covering the hole. However, the organic resin layer 102 has openings 311 communicating with the hole through the silicon substrate 101 (or the liquid flow path 403). A liquid to be ejected from the liquid ejection head is supplied from the openings 311 on the first substrate surface side, flows through the holes through the substrate (penetration ports including the liquid flow path 403 and the liquid supply ports 404) and through the liquid flow path 407 on the second substrate surface side, and is ejected from the liquid ejection opening 406.

In the liquid ejection head of the present example, the layer construction on the first substrate surface (i.e., the region 104) of the silicon substrate 101 will be described. In a region 106 that is a part of the region 104, the silicon substrate 101 is in contact with the organic resin layer 102. In the region, the first protective layer 103 is absent between the silicon substrate 101 and the organic resin layer 102. In a region 105 that is the remaining region of the region 104, the substrate is in contact with the first protective layer 103, and the first protective layer 103 is in contact with the organic resin layer 102. In the region, the first protective layer 103 is present between the silicon substrate 101 and the organic resin layer 102.

The region 106 constitutes the outer edge of the first substrate surface, and the region 105 is positioned inside the region 106 in the substrate in-plane direction.

Subsequently, the completed liquid ejection head substrate was divided by a dicing saw into individual pieces, giving liquid ejection heads. The resulting liquid ejection heads were immersed in a pigment black ink (cartridge trade name: PEI-106 BK) for a large-format ink jet printer manufactured by Canon (trade name: imagePROGRAF series) at 70° C. for 2 weeks, and a storage immersion test was performed.

Comparative Example 1

As Comparative Example 1, the same procedure as in Example 1 was performed except that a part of the first protective layer 103 on the first substrate surface (the region 106 in FIG. 6) was not removed to give a liquid ejection head, and the storage immersion test was performed.

The observation result under an electron microscope revealed that, in the liquid ejection head of Comparative Example 1, the organic resin layer 102 formed above the first substrate surface peeled around the liquid flow path pattern (the contact surface between the organic resin layer 102 and the first protective layer 103). In contrast, no change or peeling of the organic resin layer 102 was observed in the liquid ejection head of Example 1.

In Example 1, the organic resin layer 102 and the first protective layer 103 were formed on the surface of the silicon substrate 101 opposite to the surface with the energy generating element 401. However, an organic resin layer 102 and a first protective layer 103 may be formed on the substrate surface with an energy generating element 401 in some cases. In the above example, the flow path forming member 408 made from an organic resin is not in contact with the first protective layer 103. However, a flow path forming member 408 made from an organic resin may be in contact with a first protective layer 103 in some cases. The present invention is also applicable to such a case.

Example 2

As Example 2, the production method described in the second embodiment was used to produce a liquid ejection head. In the present example, a SiCN film, an inorganic material, was used as a second protective layer 301.

As with Example 1, an 8-inch silicon substrate 101 (thickness: 625 μm) having an energy generating element 401, wirings, and a driving circuit 402 was prepared.

Figure 7A:
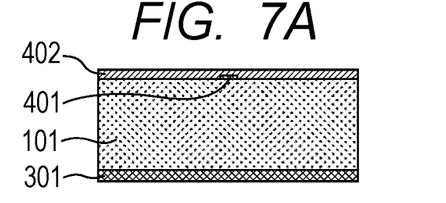
FIGS. 7A, 7B, 7C, 7D, 7E, 7F, 7G, 7H, and 7I are schematic end elevation views for describing a production process of a liquid ejection head in Example 2.

Next, a SiCN film having a thickness of 50 nm was formed as a second protective layer 301 on the first substrate surface (the lower surface in the figure) by a plasma CVD method (FIG. 7A).

Figure 7B:
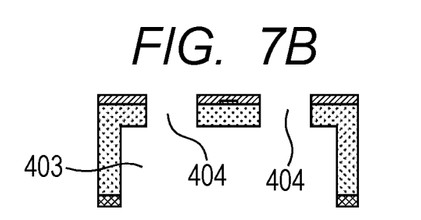

The same procedure as in Example 1 was then performed to form a hole having a depth of about 500 μm (a bottomed hole at this stage) was formed as a liquid flow path 403 on the first substrate surface. As liquid supply ports 404, holes communicating with the liquid flow path 403 were formed from the second substrate surface (FIG. 7B). Consequently, holes through the silicon substrate 101 were formed.

Figure 7C:
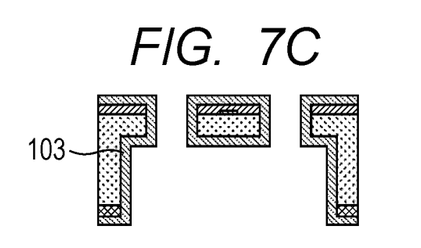
Figure 7D:
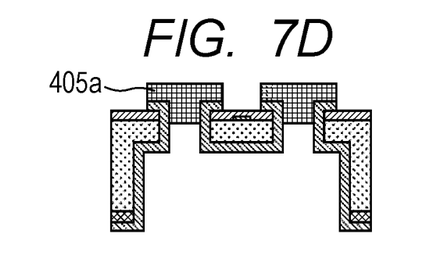
Figure 7E:
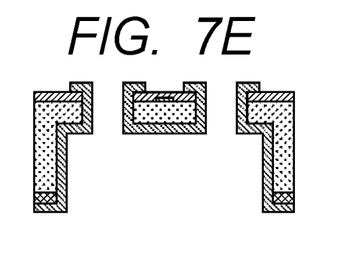
Figure 7F:
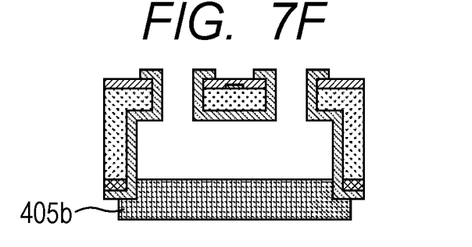
Figure 7G:
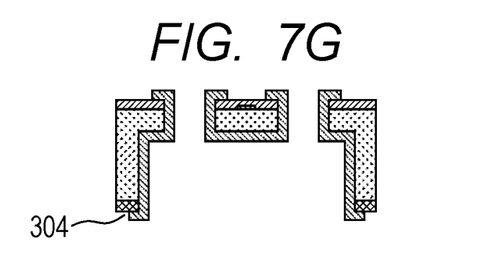

On the silicon substrate 101, a titanium oxide (TiO) film having a thickness of 85 nm was formed as a first protective layer 103 by atomic layer deposition. On the first substrate surface (the surface with the second protective layer 301) and the second substrate surface of the silicon substrate 101 and on the inner walls of the previously formed liquid flow path 403 and liquid supply ports 404 (i.e., the inner walls of the holes through the substrate), a film having a substantially uniform thickness was successfully formed (FIG. 7C).

The same procedure as in Example 1 was performed to remove an unnecessary first protective layer 103 from the first substrate surface (the surface with the second protective layer 301) and the second substrate surface (FIGS. 7D to 7G). Accordingly, the SiCN film as the second protective layer 301 was exposed in a region 304 on the first substrate surface.

Figure 7H:
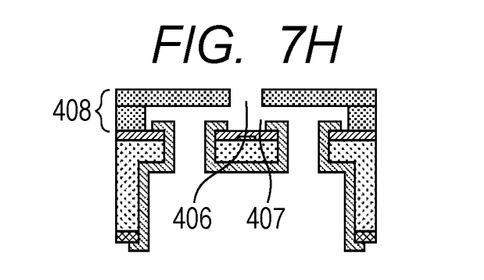
Figure 7I:
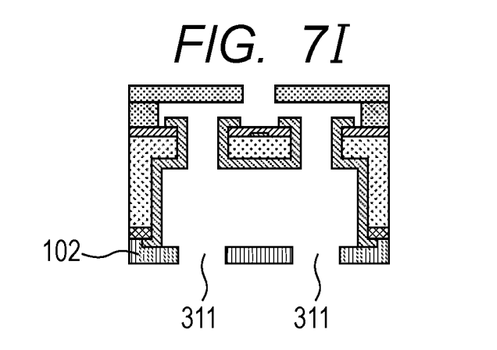
Figure 8:
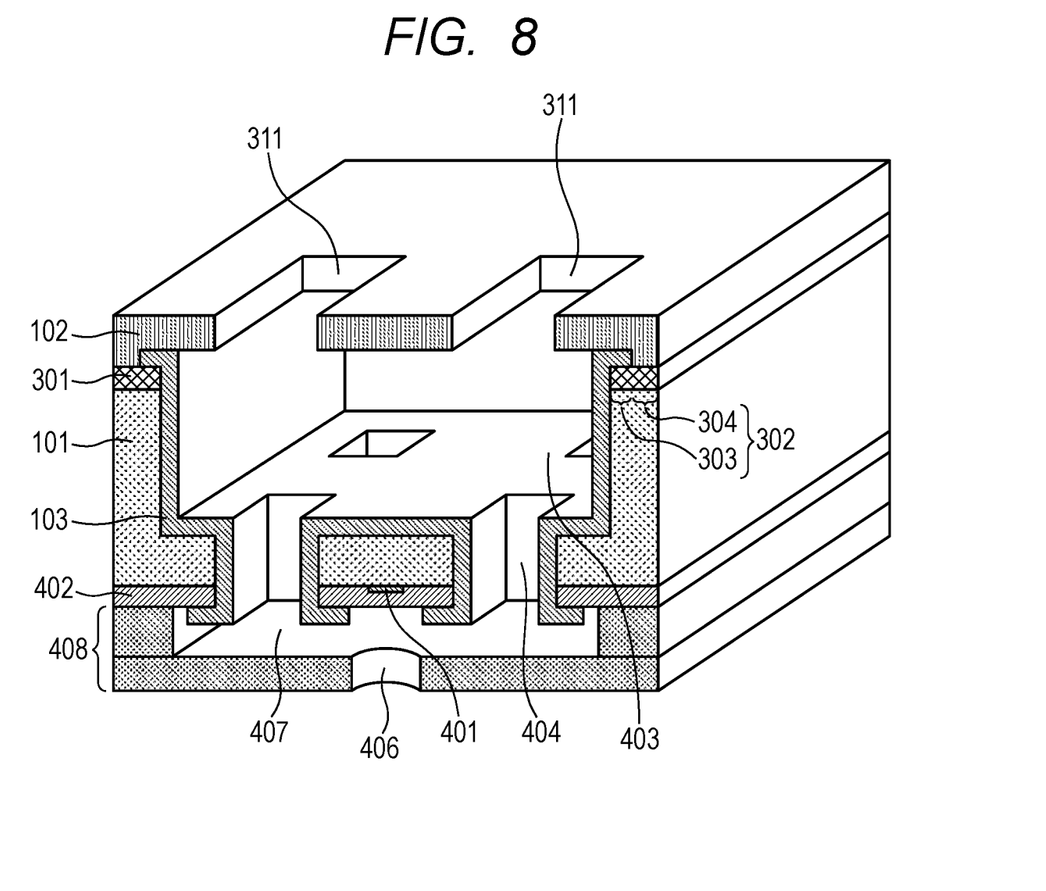
FIG. 8 is a schematic cross-sectional perspective view showing the configuration of the liquid ejection head produced in Example 2.

The same procedure as in Example 1 was performed to provide a flow path forming member 408 on the second substrate surface (FIG. 7H). The same procedure as in Example 1 was performed to form an organic resin layer 102 (a cover with openings 311) above the first substrate surface, thereby completing a liquid ejection head substrate (FIG. 7I, FIG. 8 (perspective view)). The contact area between the organic resin layer 102 and the second protective layer 301 (the area of the region above the first substrate surface from which the first protective layer 103 was removed) was designed to be 80% or more of the area of the first substrate surface in each place. Specifically, the width of the region 304 shown in FIG. 8 was 80% or more of the width of the region 302. Subsequently, the completed substrate was divided into individual pieces, giving liquid ejection heads.

The liquid ejection head of the present example differs from the liquid ejection head of Example 1 in the layer construction on the first substrate surface (i.e., the region 302) of the silicon substrate 101. In the example, the silicon substrate 101 is in contact with the second protective layer 301 in the region 302. In the region 304, the second protective layer 301 is in contact with the organic resin layer 102. In a region 303, the second protective layer 301 is in contact with the first protective layer 103, and the first protective layer 103 is in contact with the organic resin layer 102. In other words, in the region 304 that is a part of the region 302, the first protective layer 103 is absent between the silicon substrate 101 and the organic resin layer 102, and in the region 303 that is the remaining part of the region 302, the first protective layer 103 is present between the silicon substrate 101 and the organic resin layer 102. In both the partial region 304 and the remaining region 303, the second protective layer 301 is provided in contact with the silicon substrate 101.

The region 304 constitutes the outer edge of the first substrate surface, and the region 303 is positioned inside the region 304 in the substrate in-plane direction.

The completed liquid ejection head was subjected to the storage immersion test in the same manner as in Example 1. Also in the liquid ejection head of the example, no change or peeling of the organic resin layer 102 was observed.

Example 3

As Example 3, the production method described in the second embodiment was used to produce a liquid ejection head. In the example, a benzocyclobutene (BCB) resin layer, an organic resin material, was used as the second protective layer 301.

Figure 9A:
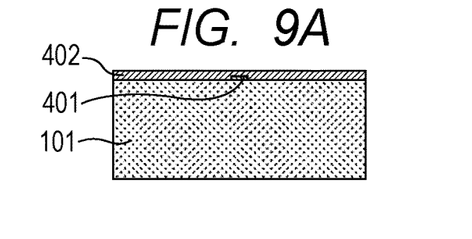
FIGS. 9A, 9B, 9C, 9D, 9E, 9F, 9G, 9H, 9I and 9J are schematic end elevation views for describing a production process of a liquid ejection head in Example 3.
Figure 9B:
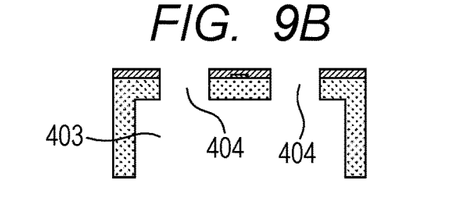
Figure 9C:
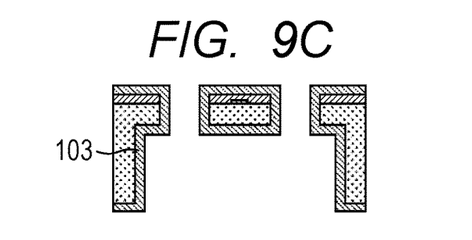
Figure 9D:
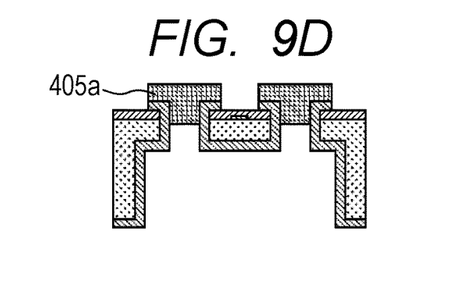
Figure 9E:
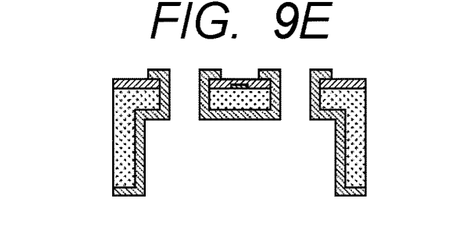
Figure 9F:
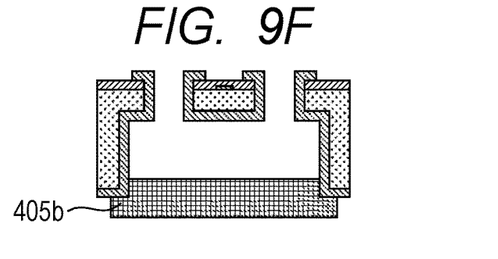
Figure 9G:
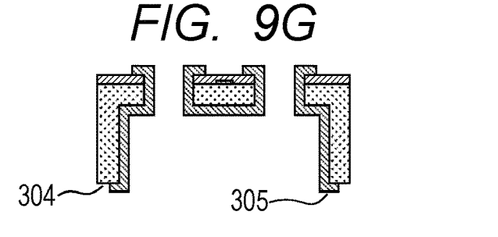
Figure 9H:
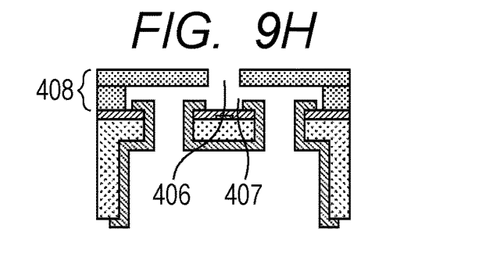

The same procedure as that described in Example 1 with reference to FIGS. 5A to 5H was performed to give a substrate in the state shown in FIG. 9H. In this stage, silicon is exposed in a region 304 on the first substrate surface (a region 302) of the silicon substrate 101, whereas the first protective layer 103 is stacked on the substrate in a region 305.

Figure 9I:
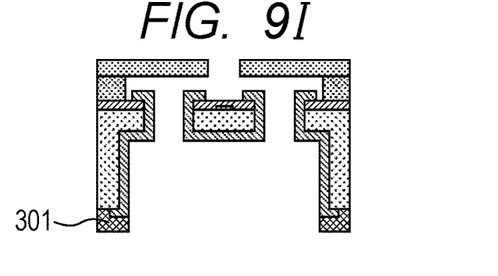

Next, a benzocyclobutene resin film was formed as the second protective layer 301. Specifically, a benzocyclobutene resin (manufactured by Dow Chemical, trade name: Cyclotene) was applied onto an 8-inch silicon substrate 101, which had been separately prepared as the substrate for transfer, by spin coating to give a thickness of 1 μm. By bringing the first substrate surface of the silicon substrate 101 into contact with the applied resin, the benzocyclobutene resin was transferred. The sample was then placed in an oven and baked in a nitrogen atmosphere at 250° C. for 1 hour to cure the benzocyclobutene resin, thereby providing a second protective layer 301 on the first substrate surface (FIG. 9I).

Figure 9J:
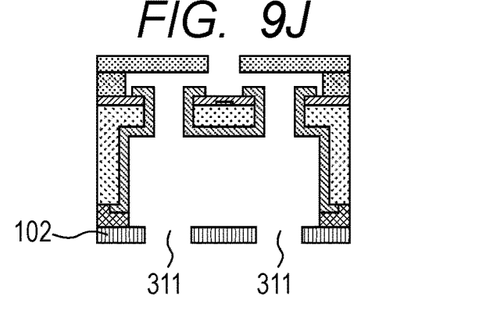
Figure 10:
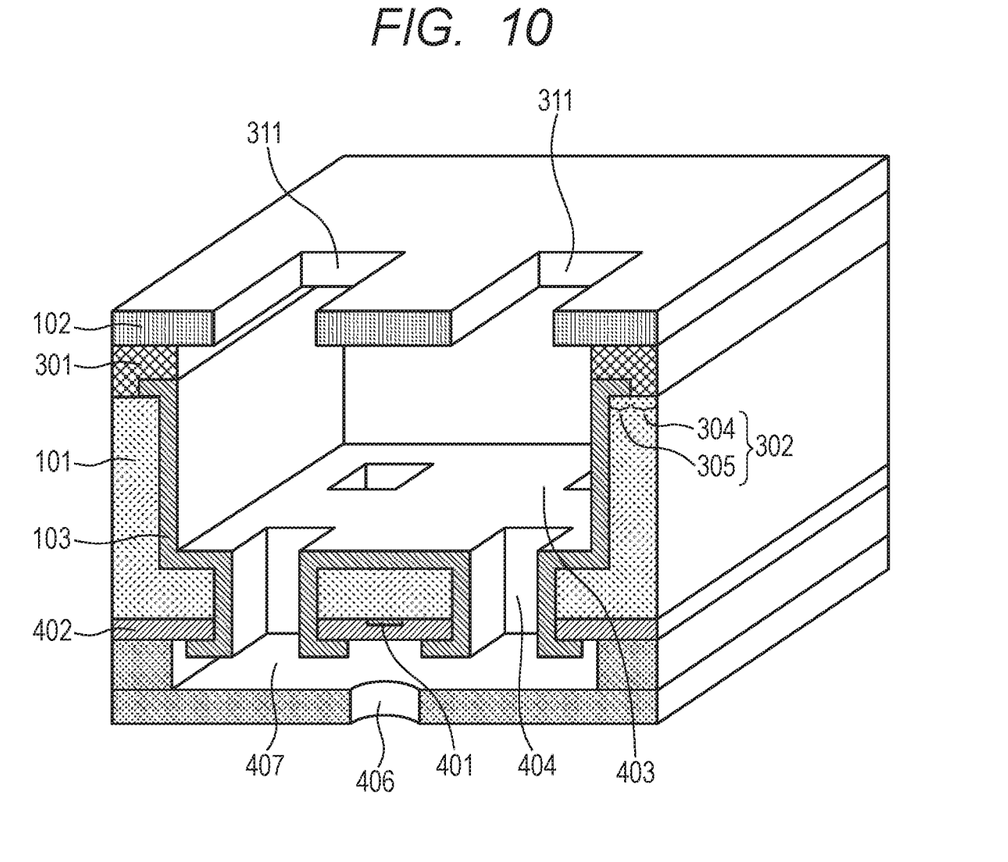
FIG. 10 is a schematic cross-sectional perspective view showing the configuration of the liquid ejection head produced in Example 3.

The same procedure as in Example 1 was performed to form an organic resin layer 102 (a cover with openings 311) on the first substrate surface, thereby completing a liquid ejection head substrate (FIG. 9J, FIG. 10 (perspective view)). The contact area between the second protective layer 301 made from the benzocyclobutene resin and the first substrate surface (the area of the region on the first substrate surface from which the first protective layer 103 was removed) was designed to be 80% or more of the area of the first substrate surface in each place. Specifically, the width of the region 304 shown in FIG. 10 was 80% or more of the width of the region 302. Subsequently, the completed substrate was divided into individual pieces, giving liquid ejection heads.

The present example differs from Example 1 in the layer construction on the first substrate surface. In the example, in a partial region (a region 304) on the first substrate surface of the silicon substrate 101, the silicon substrate 101 is in contact with the second protective layer 301, and the second protective layer 301 is in contact with the organic resin layer 102. In the remaining region (region 305) on the first substrate surface, the silicon substrate 101 is in contact with the first protective layer 103, the first protective layer 103 is in contact with the second protective layer 301, and the second protective layer 301 is in contact with the organic resin layer 102. In other words, in the region 304 that is a part of the region 302, the first protective layer 103 is absent between the silicon substrate 101 and the organic resin layer 102, and in the region 305 that is the remaining region of the region 302, the first protective layer 103 is present between the silicon substrate 101 and the organic resin layer 102. In both the partial region 304 and the remaining region 305, the second protective layer 301 is provided in contact with the organic resin layer 102.

The region 304 constitutes the outer edge of the first substrate surface, and the region 305 is positioned inside the region 304 in the substrate in-plane direction.

The completed liquid ejection head was subjected to the storage immersion test in the same manner as in Example 1. Also in the liquid ejection head of the example, no change or peeling of the organic resin layer 102 was observed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-249149, filed Dec. 22, 2016, which is hereby incorporated by reference herein in its entirety.

What is claimed is:

1. A method for producing a substrate, the substrate including a protective layer made from titanium oxide protecting silicon against corrosion, an organic resin layer on a substrate surface of a silicon substrate, and an energy generating element, the method comprising steps A-C in stated order:

step A of forming the protective layer on the substrate surface;

step B of removing the protective layer from the substrate surface in a region Z1 that is a part of a region in which the protective layer has been formed; and step C of providing the organic resin layer on the substrate surface in a region Z2 including the region Z1, wherein the organic resin layer is formed in direct contact with the substrate surface and the protective layer when the energy generating element is in a state of being capable to be driven.

2. The method according to claim 1, wherein, in the step A, the protective layer is formed by atomic layer deposition.

3. The method according to claim 1, wherein the organic resin layer is a layer made from a resin selected from the group consisting of an epoxy resin, an aromatic polyimide, an aromatic polyamide, and an aromatic hydrocarbon resin.

4. The method according to claim 1, further comprising, before the step A, a step of forming a hole on the substrate surface, wherein, in the step A, the protective layer is formed also on an inner wall surface of the hole, and wherein the organic resin layer continues over an opening of the hole and has an opening communicating with the hole.

5. The method according to claim 1, wherein the region Z2 is larger than the region Z1.

6. The method according to claim 1, wherein a proportion of an area of the region Z1 to an area of the region Z2 is 50% or more.

7. The method according to claim 4, wherein an area of the opening is smaller than an area of the hole.

* * * * *